United States Patent
Zhong et al.

(10) Patent No.: US 7,266,749 B1
(45) Date of Patent: Sep. 4, 2007

(54) TRELLIS CONSTRUCTION BASED ON PARITY CHECK MATRIX FOR BCH CODE

(75) Inventors: Yan Zhong, San Jose, CA (US); Lin Yang, Fremont, CA (US)

(73) Assignee: Legend Silicon Corporation, Fremont, CA (US)

( * ) Notice: Subject to any disclaimer, the term of this patent is extended or adjusted under 35 U.S.C. 154(b) by 1156 days.

(21) Appl. No.: 10/186,128

(22) Filed: Jun. 27, 2002

(51) Int. Cl.
H04L 1/14 (2006.01)
(52) U.S. Cl. .................................... 714/756
(58) Field of Classification Search ............... 714/755, 714/752, 781, 782, 784, 786; 375/341
See application file for complete search history.

(56) References Cited

U.S. PATENT DOCUMENTS

| | | | | |
|---|---|---|---|---|
| 4,933,956 A | * | 6/1990 | Forney, Jr. | 375/341 |
| 5,440,570 A | * | 8/1995 | Wei et al. | 714/782 |
| 6,065,147 A | * | 5/2000 | Pyndiah et al. | 714/755 |
| 6,802,037 B2 | * | 10/2004 | Kim et al. | 714/755 |

OTHER PUBLICATIONS

Moorthy et al. Good Trellises for IC Implementation of Viterbi Decoder for Linear Block Codes. IEEE transactions on communications vol. 45 No. 1 Jan. 1997. pp. 52-63.*

Vardy et al.Maximum-likelihood soft decision decoding of BCH codes. IEEE transaction on information theory vol. 40, No. 2 Mar. 1994.pp. 546-554.*

Pan, Faster solution of the key equation for decoding BCH error-correcting codes. ACM 1997. pp. 168-175.*

Pietroborn et al. Trellis coding with multidimensional QAM Signal sets. IEEE transactions on information theory vol. 39, No. 2, March 325. pp. 325-336.*

* cited by examiner

Primary Examiner—Guy Lamarre
Assistant Examiner—Sam Rizk
(74) Attorney, Agent, or Firm—Patent Law Group LLP; Carmen C. Cook

(57) ABSTRACT

A method for constructing a simplified trellis diagram for BCH-encoded information is disclosed. BCH-encoded information is received, having a corresponding parity check matrix H. The parity check matrix H is expressed as an ordered sequence of columns of matrices. A sequence of sub-code words is provided, corresponding to one or more code words, each satisfying a given condition. A matrix $H^{cp}$, having columns that are generated as a selected permutation of the columns of the matrix H through a column-permutation-for-binary-matching process, is provided, and a sequence of sub-matrices and a corresponding sequence of permuted sub-code words is provided. A trellis diagram, representing an ordered sequence of code word transitions in the received information and symmetric about a central location, is provided for each code word c, connecting n+1 stages, numbered i=0, 1, . . . , n, in an ordered sequence.

4 Claims, 3 Drawing Sheets

TRELLIS CONSTRUCTION BASED ON PARITY CHECK MATRIX FOR BCH CODE

FIELD OF THE INVENTION

This invention relates to construction of an optimal trellis diagram, based on a parity check matrix for BCH encoding for error detection.

BACKGROUND OF THE INVENTION

A product code is a multi-dimensional array of (n,k) linear block code that exploits a simple and relatively efficient method to construct more powerful codes using linear block code structures. FIG. 1 illustrates construction of a two-dimensional block product code, using a k1×k2 array of data to be encoded.

In the encoding, each row of k2 data values is augmented to include n2−k2 parity check bits for the data in that row; and each column of k1 data values is augmented to include n1−k1 parity check bits for the data in that column. The (n1−k1)×(n2−k2) region at the lower right of this block contains parity check bits for each of the n2−k2 columns above and for each of the n1−k1 rows to the left. Where, for example, a 64QAM configuration is adopted, k1=k2=57 and n1=n2=63. Because 57=$2^6$−6−1, the 7 conventional parity check bits can be replaced by 7 error check bits (Hamming, BCH, etc.), as discussed in S. B. Wicker, *Error Control Systems*, Prentice Hall, Englewood Cliffs NJ, 1995, pp. 8-11, 90-94 and elsewhere. Use of a QAM constellation is discussed by W. Tomasi, *Electronic Communication Systems*, Prentice Hall, Englewood Cliffs, NJ, 1988, pp. 503-527.

Use of a trellis construction for block and convolution codes allows an improvement in effective bit transfer rate, through a procedure discussed in some detail in S.B. Wicker, ibid., pp. 356-392. The procedure includes (1) insertion of a redundant bit for every m bits, (2) expansion of the signal constellation (e.g., QAM) from $2^m$ to $2^{m+1}$ symbols, and (3) use of an (m+1)-bit encoded source block to specify a signal from the expanded constellation. However, construction of a trellis diagram for optimal BCH decoding has not been disclosed.

What is needed is an approach for constructing a simplified trellis diagram that is optimal for BCH decoding.

SUMMARY OF THE INVENTION

These needs are met by the invention, which provides a method and system for constructing a trellis diagram that, in one embodiment, relies on the following sequence of processes: (1) receiving BCH-encoded information having a corresponding (n−k)×(n) parity check matrix H, constructed according to a BCH error code, where n and k are selected positive integers with k<n; (2) expressing the parity check matrix H as an ordered sequence of columns of matrices {$h_1$, $h_2$, ..., $h_n$}; (3) providing a sequence of sub-code words $a_i$={$c_1$, ..., $c_i$} (i=1, ..., n), corresponding to at least one code word c={$c_1$, ..., $c_n$} that satisfies c·$H^{tr}$=$0_{n-k}$; (4) providing a matrix $H^{cp}$, having columns {$h^{cp}_1$, $h^{cp}_2$, ..., $h^{cp}_n$} that are a selected permutation of the columns of the matrix H, forming a sequence of sub-matrices $H^{cp}_i$={$h^{cp}_1$, ..., $h^{cp}_i$}, forming a corresponding permuted code word $c^{cp}$={$c^{cp}_1$, ..., $c^{cp}_n$}, and forming a sequence of corresponding permuted sub-code words $a^{cp}_i$={$c^{cp}_1$, ..., $c^{cp}_i$}; and (5) providing a trellis diagram, symmetric about a central location and representing an ordered sequence of code word transitions, in the received information, for the at least one code word c, connecting n+1 stages, numbered i=0, 1, ..., n, in an ordered sequence, where each of stage i=0 and stage i=n in the trellis has one state, each stage has at least one state, and (i) where the number of states in stage i+1 is no greater than the number of states in stage i, the number of input branches for each state in stage i+1 is 2, (ii) where the number of states in stage i+1 is greater than the number of states in stage i, the number of input branches for each state in stage i+1 is 1, and (iii) a state in stage i+1 is determined by a sum of a corresponding state in stage i and a product of the matrix $H^{cp}_i$ and the sub-code word bit value $a^{cp}_i$. Preferably, the trellis diagram is constructed so that no state has more than two input branches or more than two output branches.

Optionally, the trellis diagram is constructed so that the number of states in a stage i is equal to the number of states in a stage n−i, for 0<i<n/2.

DESCRIPTION OF BEST MODES OF THE INVENTION

Figure 1:
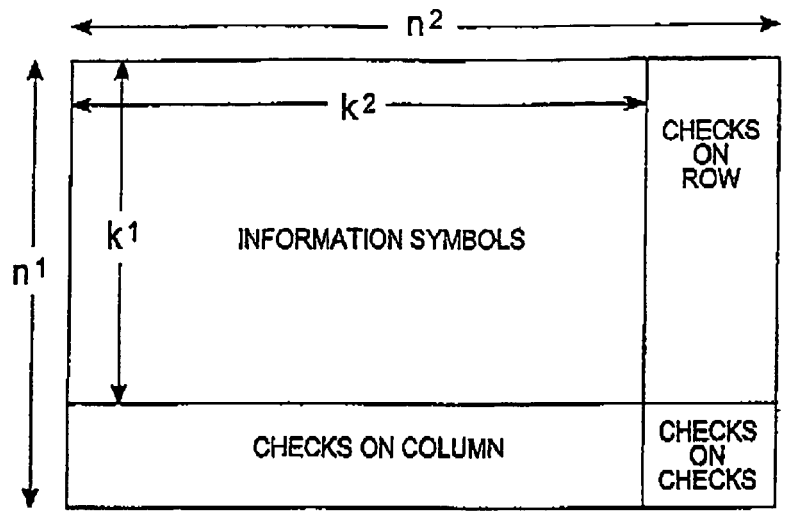
FIG. 1 illustrates a k1×k2 data array, augmented by n1−k1 columns and n2−k2 rows of error check bits.
Figure 2:
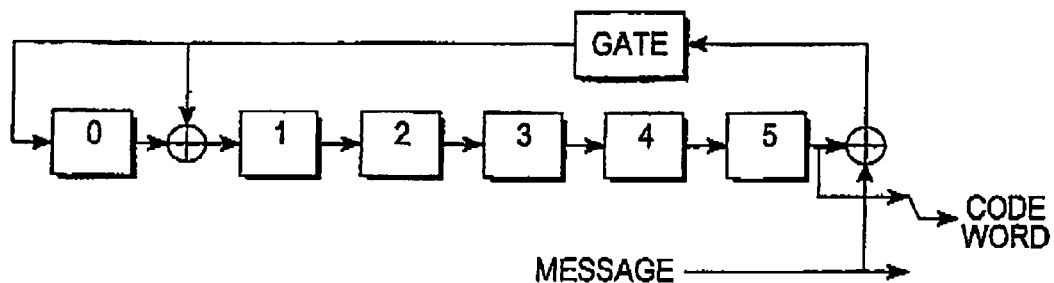
FIG. 2 illustrates an encoder structure for BCH(64,57).

Among 64 bits generated in an encoder, the first 57 MSB bits are message bits that have been received by the encoder, which may have the structure illustrated in FIG. 2. After these 57 input bits have been issued as output bits, the next 6 bits, stored at the registers 0-5, are issued as output bits. The last (64th) output bit is the modulo-2 sum of the first 63 bits.

A Bose-Chaudury-Hocquenheim (BCH) error detection and correction code, such as BCH(64,57) with 7 error check bits, is generated by a particular generator polynomial, such as p(x)=$x^6$+x+1, with an encoder structure illustrated in FIG. 2, where the first 57 bits are received as an input signal by the encoder. The encoder provides a 64-bit output signal, including 6 supplementary bits for error check and a final bit that is a modulo-2 sum of the first 63 bits. More generally, one can specify a linear block code C, using a k×n generator matrix G over GF(2)

$$G = \begin{bmatrix} g_1 \\ g_2 \\ ... \\ g_k \end{bmatrix} = \begin{bmatrix} g_{11} & g_{12} & ... & g_{1N} \\ g_{21} & g_{22} & ... & g_{2N} \\ ... \\ g_{k1} & g_{k2} & ... & g_{kN} \end{bmatrix} \quad (1)$$

where the row matrices $g_1$, $g_2$, ..., $g_k$ are linearly independent over the field GF(2). The $2^K$ linear combinations of the K row matrices $g_k$ of G provide a code word space.

If A=(a1, a2, ..., ak) is a message to be encoded, a natural encoding procedure maps the message A into a code word u=($u_1$, $u_2$, ..., $u_n$), where $$u = a \cdot G = a1 \cdot g_1 + a2 \cdot g_2 + ... + ak \cdot g_k, \quad (2)$$

and the ith component of the code word becomes $$u_i = a1 \cdot g_{1i} + a2 \cdot g_{2i} + \ldots + ak \cdot g_{ki}; \quad (3)$$

k information bits are encoded into n bits and shifted serially onto the channel.

The generator matrix for a BCH(n,n–k) code is expressible as $$G = \begin{bmatrix} 1 & 0 & 0 & \ldots & 0 & 0 & p_{0,0} & p_{0,1} & \ldots & p_{0,n-k-1} \\ 0 & 1 & 0 & \ldots & 0 & 0 & p_{1,0} & p_{1,1} & \ldots & p_{1,n-k-1} \\ \ldots & & & & & & & & & \\ 0 & 0 & 0 & & 1 & 0 & p_{k-2,0} & p_{k-2,1} & \ldots & p_{k-2,n-k-1} \\ 0 & 0 & 0 & & 0 & 1 & p_{k-1,0} & p_{k-1,1} & \ldots & p_{k-1,n-k-1} \end{bmatrix} \quad (4)$$

$$= [I_k \mid P_{n-k}],$$

where $I_k$ is a k×k identity matrix and $P_{n-k}$ is an (n–k)×(k) matrix of rank at most n–k.

A binary (n,k) linear block code C is uniquely specified by an (n–k)×(n) matrix H over GF(2), sometimes referred to as a parity check matrix for G. In systematic form, H is an (n–k)×(n) matrix, expressible as $$H = \begin{bmatrix} p_{00} & \ldots & p_{k-1,0} & 1 & 0 & \ldots & 0 & 0 \\ p_{01} & \ldots & p_{k-1,1} & 0 & 1 & \ldots & 0 & 0 \\ \ldots & & & & & & & \\ p_{0,n-k-2} & \ldots & p_{k-1,n-k-2} & 0 & 0 & \ldots & 1 & 0 \\ p_{0,n-k-1} & \ldots & p_{k-1,n-k-1} & 0 & 0 & \ldots & 0 & 1 \end{bmatrix} \quad (5)$$

$$= [P_{(n-k) \times (k)}{}^{tr} \mid I_{n-k}].$$

and the n–k rows are linearly independent. A binary n-tuple $v = (v_1, \ldots, v_n)$ is a code word in C if and only if $$u \cdot H^{tr} = 0_{n-k}. \quad (6)$$

A binary (n,k) linear block code in C can be represented by an n-section trellis diagram, referred to as "T," over a sequence of stages $\{0, 1, 2, \ldots, n\}$. A trellis T is a directed graph consisting of n+1 levels of nodes (states) and edges (branches) that displays or represents the stage-varying behavior of the corresponding encoder. A trellis includes the following features:

1. The state space of the trellis at a node corresponding to stage m ($0 \leq m \leq n$), denoted $\Sigma_m C$, is the set of states at that stage. At stage 0, only one (initial) node, $\sigma_0$, is available. At stage n, only one (final) node $\sigma_n$ exists. For intermediate stages, more than one state may be available.

2. For $t_0 \leq t_m \leq t_n$, a branch in section m of the trellis T connects a state $\sigma_{m-1} \epsilon \Sigma_{m-1} C_m$, to a state $\sigma_m \epsilon \Sigma_m C_m$, and has a label $v_{m-1}$ that represents the encoder output in a stage interval $t_{m-1} \leq t \leq t_m$ (or (m–1,m)).

3. Except for the initial and final states, every (intermediate) state has at least one, but no more than two, incoming branches and at least one, but no more than two, outgoing branches. An initial (final) state has no incoming (no outgoing) branches. Two branches diverging from the same state have labels that differ from each other.

4. A directed path from an initial state so to a final state $s_n$ exists with a label sequence $\{v_0, v_1, \ldots, v_n\}$ if and only if $\{v_0, v_1, v_n\}$ is in C.

A trellis diagram for C is referred to as "minimal" if the number of states at each of the stages is a minimum. A minimal trellis is unique, except for graph isomorphisms. A minimal trellis is constructed here, using a parity check matrix, and will be used to decode a BCH (64,57) code. Consider a binary (n,k) linear block code C having a parity-check matrix $$H = \{h_1, h_2, \ldots, h_n\}. \quad (7)$$

where the column matrices $h_j$ denotes matrices for column j ($1 \leq j \leq n$), which is a binary (n–k)-tuple. A binary n-tuple u is a code word in C if and only if u satisfies Eq. (6).

A (column-permuted) matrix $H^{cp} = \{h^{cp}_1, h^{cp}_2, \ldots, h^{cp}_n\}$ is formed, having columns that are a selected permutation of the columns of the matrix H, referred to as a "column-permutation-for-binary-matching" and described in the following. For $1 \leq i \leq n$, let $H_i$ denote the (n–k)×(i) sub-matrix $$H^{cp}_i = \{h^{cp}_1, \ldots, h^{cp}_i\}, \quad (8)$$

let $$c^{cp} = \{c^{cp}_1, \ldots, c^{cp}_n\} \quad (9)$$

be a permuted code word, constructed according to the same permutation, and let $$a^{cp}_i = \{c^{cp}_1, \ldots, c^{cp}_i\} \quad (10)$$

be a permuted sub-code word of the permuted code word ccp (stages 0 to stage i).

State and branch labeling of the trellis are defined as follows. The label of a state $\sigma_i \epsilon \Sigma_i C$, denoted $S(\sigma_i)$ is a binary (n–k)-tuple $$S_{(\sigma i)} = a^{cp}_i \cdot H^{cp}_i{}^{tr} = (s_1, s_2, \ldots, s_{n-k}). \quad (11)$$

For i=0, the initial state $\sigma_0$ is labeled with an all-zero-entry (n–k)-tuple, $0_{n-k}$. For i=n, where acpi =ccp, the final state is also labeled with $0_{n-k}$. For intermediate states ($1 \leq i \leq n-1$), let $\sigma_i \epsilon \Sigma_i C$ and $\sigma_{i+1} \epsilon \Sigma_{i+1} C$ be adjacent states, and let $u_{i+1}$ by the branch in the code trellis that connects the states $\sigma_i$ and $\sigma_{i+1}$. The label $u_{i+1}$ is the permuted encoder output bit in the stage interval (i,i+1), from stage i to stage i+1, and is set forth in Eq. (3). For each path $(u_1, u_2, \ldots, u_i)$ connecting $\sigma_0$ and $\sigma_i$, the path $(u_0, \ldots, u_{i+1})$, obtained by concatenating the first path with $u_{i+1}$, is a path connecting $\sigma_0$ and $\sigma_{i+1}$ through the state $\sigma_i$. The state label $S(\sigma_{i+1})$ is verified to be $$S(\sigma_{i+1}) = (u_1, \ldots, u_i, u_{i+1}) \cdot H^{cp}_{i+1}{}^{tr} = S(\sigma_i) + u_{i+1} \cdot h^{cp}_{i+1}{}^{tr}. \quad (12)$$

This last relation indicates that, for a "starting" state, labeled $S(\sigma_i)$, and an output code bit $u_{i+1}$ for the stage interval (i,i+1), the designation state label $S(\sigma_{i+1})$ at stage i+1 is uniquely determined.

The complexity of the trellis diagram depends upon the structure of the parity check matrix H. By permuting the order of the columns of H and of the code words c, and thus changing the order of the encoded symbols, the trellis can be simplified or made more complex.

Appendix A sets forth the original matrix H for the BCH(64,57) code. Appendices B and C illustrate operations that map H onto a column-permuted matrix Hcp, which is set forth in Appendix D. Implementation of a "column-permutation-for-binary-matching" process, as illustrated in the Appendices A-D, involves the following: (1) rearrange the columns H(m) (m=0, . . . , n–1) of the matrix H in order of increasing (or decreasing) order of binary value of the column entries; (2) form contiguous pairs of columns H(m') and H(m") for which a modulo-two sum, without carry, of corresponding entries for entries in these two columns produce a selected ordered sequence of binary values (here selected to be the binary value sequence 0111100); (3) provide a sequence of the n/2 contiguous pairs for which (i) the first n/8 pairs have LSB=1 and have MSB=1, (ii) the next n/8 pairs have LSB=0 and MSB=1, (iii) the next n/8 pairs have LSB=0 and MSB=0, and (iv) the remaining n/8 pairs have LSB=1 and MSB=0. This assumes that the integer n is divisible by 8.

Figure 4:
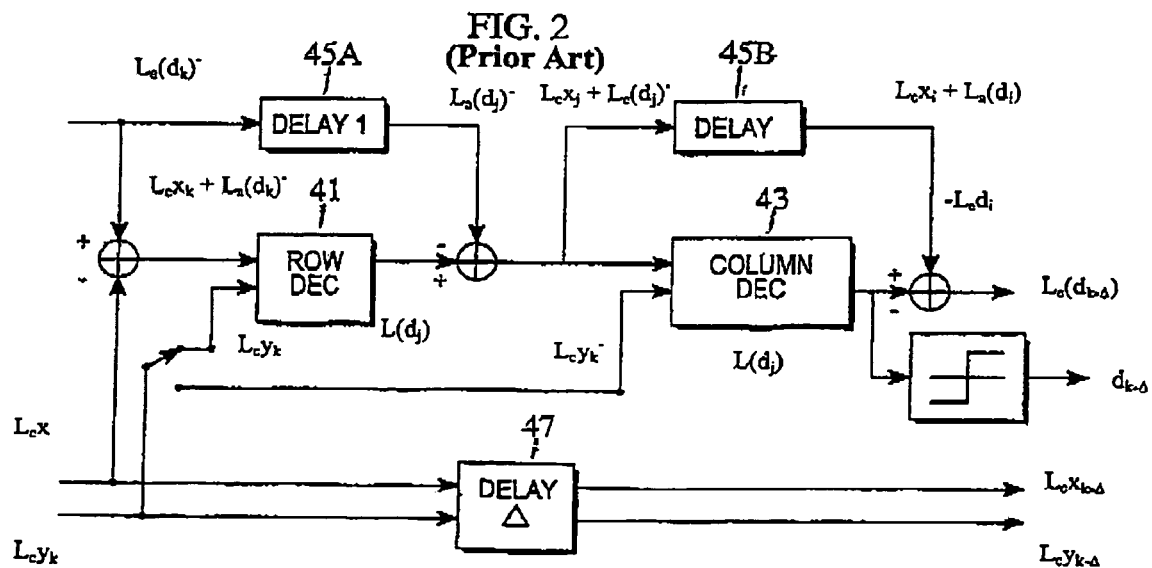
FIG. 4 illustrates an iterative system for decoding according to the invention.
Figure 3:
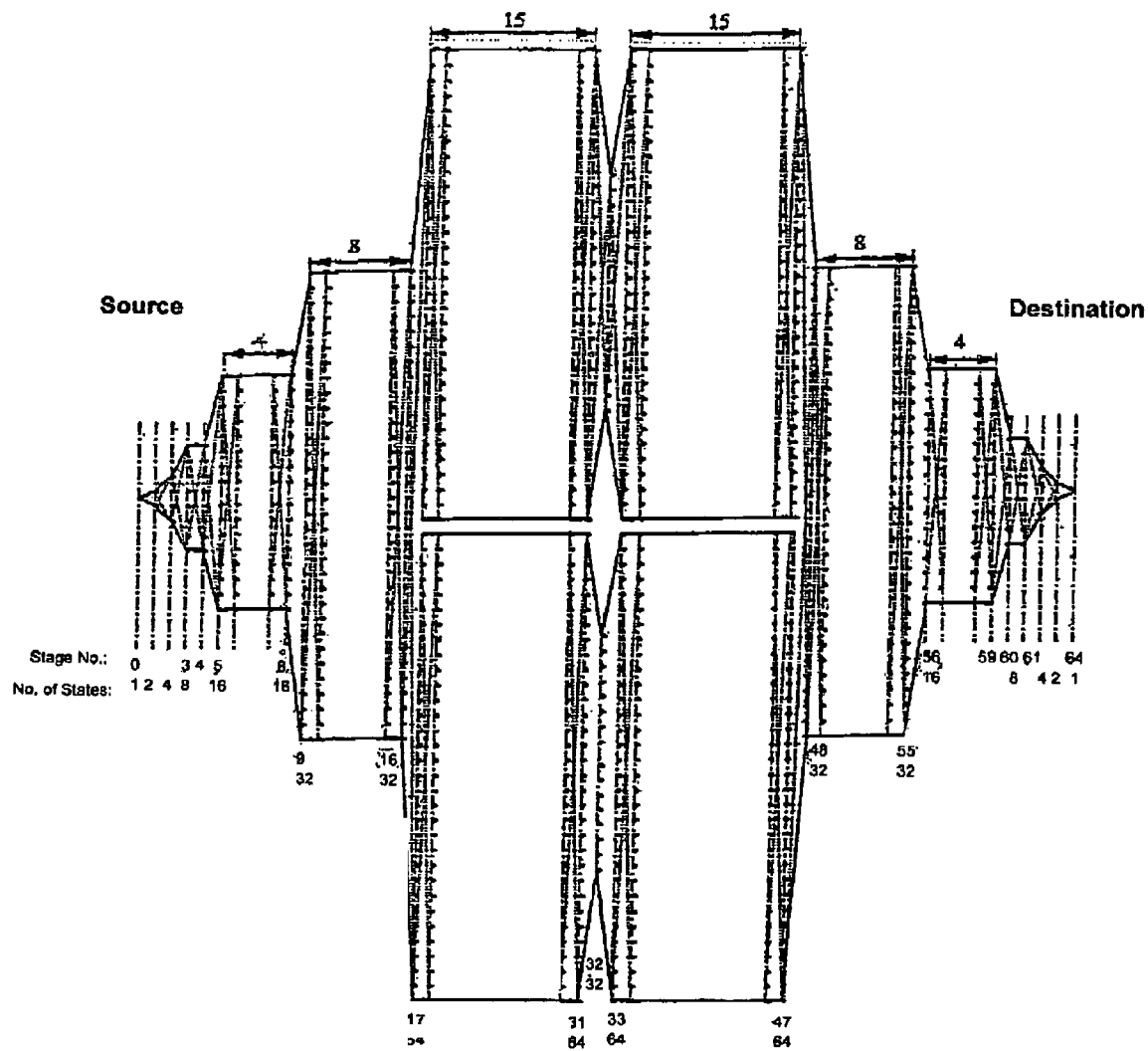
FIG. 3 illustrates a simplified trellis structure for a BCH (64,57) code.

The matrix $H^{cp}$ has a corresponding modified trellis diagram, illustrated in FIG. 3, that is used in the decoder of FIG. 4. FIG. 4 illustrates an iterative system for decoding according to the present invention. The system of FIG. 4 includes a delay element 45A, a delay element 45B, a row decoder 41, a column decoder 43 and a delay element 47. The trellis diagram shown in FIG. 3 has 65 stages, corresponding to up to 64 possible sets of column permutations. Generally, an optimal trellis diagram is symmetric about a central location so that the number of states in stage i is equal to the number of states in stage n−i. Preferably, an optimal trellis diagram is constructed so that (a) where the number of states in stage number i+1 (>1) is no greater than the number of states in stage i, each state in the stage i+1 has two input branches and (b) where the number of states in stage number i+1 is greater than the number of states in stage i, each state in stage i+1 has one input branch. Each of the first stage (i=0) and the last stage (i=n) has one state, and all other stages have at least one state. Appendix E describes in more detail how to generate sections, states and branches of an optimal trellis for a BCH(64,57) code, as an example.

For the particular example shown in FIG. 3, the number of states in a first group of stages ($1 \leq i < n/2$) increases monotonically from one state (at i=1) as the stage number i increases toward n/2; the number of states in a second group of stages (n/2<i<n) decreases monotonically to one state (at i=n) as the stage number increases toward n; and a central stage (i≈n/2) may have fewer states than the two adjacent stages, i≈n/2−1 and i≈n/2+1. These features may not be present in a more general setting.

Because an (n,k) linear block code can be represented as a trellis, one can always decode the code using MAP (Maximum a posteriori probability) and an iterative decoding algorithm that were originally used in decoding convolutional code. A preferred embodiment uses a Maximum-Log-MAP algorithm. The MAP and Maximum-Log-MAP algorithms are well known to workers in this field.

The particular trellis in FIG. 3 has the following features.
1. The first stage and the last stage of the trellis each have one state. The number of states in a stage increases from 1, to 2, to 4, to 8 in stages 0-3, remains at 8 for stages 3-4, increases to 16 states at stage 5, remains at 16 states for stages 5-8, increases to 32 states at stage 9, remains at 32 states for stages 9-16, increases to 64 states at stage 17, remains at 64 states for stages 17-31, decreases to 32 states at stage 32, increases to 64 states at stage 33, remains at 64 states for stage 33-47, decreases to 32 states at stage 48, remains at 32 states for stages 48-55, decreases to 16 states at stage 56, remains at 16 states for stages 56-59, and decreases to 8 for stages 60-61, and decreases to 4, to 2 and to 1 state for stages 62-64. FIG. 3 is symmetric about stage 32.
2. For stages 33 and beyond, because some of the states that have already appeared in stages 1-32 will not appear (again), by a proper state mapping one can use labels 0-63 to express the existing states at each stage. For example, state 93 can map to state 1, state 94 can map to state 2, and so on. As a result of this (re) mapping, the trellis in FIG. 3 has a symmetric structure, where the number of states and state labels in each of stages 64 to 33 is the same as the number of states in a corresponding stage 0 through 31.
3. The collection of stages 17-47 can be decomposed into an upper sub-trellis (with an even number of state labels) and a low sub-trellis (with an odd number of state labels).
4. Where the number of states in stage i+1 is no greater than the number of states in stage i, the number of input branches for each state in stage i+1 is 2. Where the number of states in stage i+1 is greater than the number of states in stage i, the number of input branches is 1.

Figure 5:
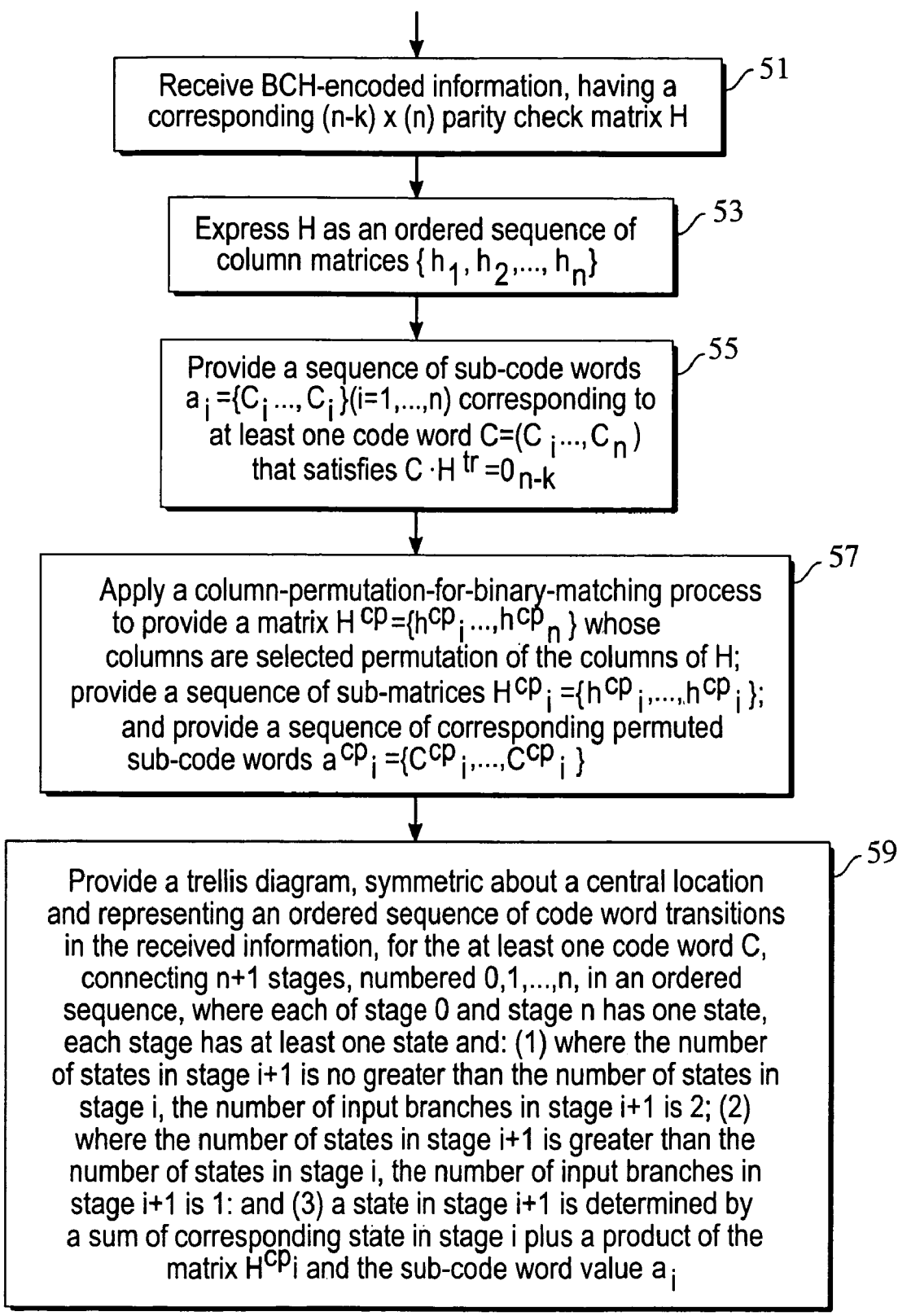
FIG. 5 is a flow chart of a procedure for practicing the invention.

FIG. 5 is a flow chart illustrating one procedure for constructing an optimal trellis diagram. In step 51, the system receives BCH-encoded information having a corresponding (n−k)×(n) parity check matrix H, constructed according to a BCH error code, where n and k are selected positive integers with k<n. In step 53, the system expresses the parity check matrix H as an ordered sequence of columns of matrices $\{h_1, h_2, \ldots, h_n\}$. In step 55, the system provides a sequence of sub-code words $a_i = \{c_1, \ldots, c_i\}$ (i=1, \ldots, n), corresponding to at least one code word $c = \{c_1, \ldots, c_n\}$ that satisfies $c \cdot H^{tr} = 0_{n-k}$. In step 57, the system provides a matrix $H^{cp}$, having columns $\{h^{cp}_1, h^{cp}_2, \ldots, h^{cp}_n\}$ that result from a "column-permutation-for-binary-matching" process, applied to the matrix H, and forms a sequence of sub-matrices $H^{cp}_i = \{h^{cp}_1, \ldots, h^{cp}_i\}$; and the system provides a sequence of corresponding permuted sub-code words $a^{cp}_i = \{c^{cp}_1, \ldots, c^{cp}_i\}$, using the same selected permutation.

In step 59, the system provides a trellis diagram, symmetric about a central location and representing an ordered sequence of code word transitions, in the received information, for the at least one code word c, connecting n+1 stages, numbered i=0, 1, \ldots, n, in an ordered sequence, where each of stage i=0 and stage i=n in the trellis has one state, each stage has at least one state, and (i) where the number of states in stage i+1 is no greater than the number of states in stage i, the number of input branches for each state in stage i+1 is 2, (ii) where the number of states in stage i+1 is greater than the number of states in stage i, the number of input branches for each state in stage i+1 is 1, and (iii) a state in stage i+1 is determined by a sum of a corresponding state in stage i and a product of the matrix $H^{cp}_i$ and the sub-code word bit value $a^{cp}_i$.

The generator polynomial $g(x) = x^6 + x + 1$ is one of a group of polynomials in $GF(2^m)$, for the particular choice m=6, that can be used here, as set forth in S. B. Wicker, ibid., pp. 444-445. This group of generator polynomials includes the following:

$g(x) = x^6 + x + 1$, $g(x) = x^6 + x^5 + 1$, $g(x) = x^6 + x^5 + x^3 + x^2 + 1$, $g(x) = x^6 + x^5 + x^4 + x + 1$, $g(x) = x^6 + x^5 + x^2 + x + 1$, $g(x) = x^6 + x^4 + x^3 + x + 1$.

APPENDIX A

H (Parity Check) Matrix Elements of BCH(64.57) Code.

H(63) = 1000011
H(62) = 1100010
H(61) = 1110011

APPENDIX A-continued

H (Parity Check) Matrix Elements of BCH(64.57) Code.

H(60) = 1111010
H(59) = 1111111
H(58) = 1111100
H(57) = 0111110
H(56) = 1011101
H(55) = 0101111
H(54) = 1010100
H(53) = 0101010
H(52) = 1010111
H(51) = 1101000
H(50) = 0110100
H(49) = 0011010
H(48) = 1001111
H(47) = 1100100
H(46) = 0110010
H(45) = 1011011
H(44) = 1101110
H(43) = 1110101
H(42) = 0111011
H(41) = 1011110
H(40) = 1101101
H(39) = 0110111
H(38) = 1011000
H(37) = 0101100
H(36) = 0010110
H(35) = 1001001

Appendix B. Mapping of Parity Check Matrix H To Matrix $H^{cp}$.

The original parity check matrix H is mapped onto a column-permuted matrix Hcp, having the same dimensions, in the following manner. One first permutes the columns of the matrix H to form a matrix H2 in which the binary values corresponding to each column (e.g., H(08), which has a binary value of 1 +4+8=13) are arranged in a strictly monotonically increasing array, as indicated in the following. One then associates with each other two separate columns that have a modulo-two sum (without carry) equal to a selected binary array, here chosen to be the array {0 1 1 1 1 0 0}; other seven-entry arrays can also be used for the binary matching. In the following, each column entry for the matrix H2 has a corresponding (unique) second column entry ("addend") for which the modulo-two sum is the array {0 1 1 1 1 0 0 0}, as indicated. The column entries of the matrix H2 are transposed or permuted so that a column entry and its corresponding addend column entry are contiguous. The result of this operation is the column-permuted matrix $H^{cp}$ (or H3) shown in Appendix C. This total process (H→H2→$H^{cp}$) is referred to herein as the column-permutation-for-binary-matching process.

| H2 Matrix Column Entry | Addend Column |
|---|---|
| H2(63) = H(59) = 1 1 1 1 1 1 1 | H(63) = 1 0 0 0 0 1 1 |
| H2(62) = H(58) = 1 1 1 1 1 0 0 | H(06) = 1 0 0 0 0 0 0 |
| H2(61) = H(60) = 1 1 1 1 0 1 0 | H(12) = 1 0 0 0 1 1 0 |
| H2(60) = H(21) = 1 1 1 1 0 0 1 | H(26) = 1 0 0 0 1 0 1 |
| H2(59) = H(22) = 1 1 1 0 1 1 0 | H(32) = 1 0 0 1 0 1 0 |
| H2(58) = H(43) = 1 1 1 0 1 0 1 | H(35) = 1 0 0 1 0 0 1 |
| H2(57) = H(61) = 1 1 1 0 0 1 1 | H(48) = 1 0 0 1 1 1 1 |
| H2(56) = H(30) = 1 1 1 0 0 0 0 | H(18) = 1 0 0 1 1 0 0 |
| H2(55) = H(44) = 1 1 0 1 1 1 0 | H(24) = 1 0 1 0 0 1 0 |
| H2(54) = H(40) = 1 1 0 1 1 0 1 | H(16) = 1 0 1 0 0 0 1 |
| H2(53) = H(23) = 1 1 0 1 0 1 1 | H(52) = 1 0 1 0 1 1 1 |
| H2(52) = H(51) = 1 1 0 1 0 0 0 | H(54) = 1 0 1 0 1 0 0 |
| H2(51) = H(31) = 1 1 0 0 1 1 1 | H(45) = 1 0 1 1 0 0 0 |
| H2(50) = H(47) = 1 1 0 0 1 0 0 | H(38) = 1 0 1 1 0 0 0 |

| H2 Matrix Column Entry | Addend Column |
|---|---|
| H2(49) = H(62) = 1 1 0 0 0 1 0 | H(41) = 1 0 1 1 1 1 0 |
| H2(48) = H(11) = 1 1 0 0 0 0 1 | H(56) = 1 0 1 1 1 0 1 |
| H2(47) = H(41) = 1 0 1 1 1 1 0 | H(62) = 1 1 0 0 0 1 0 |
| H2(46) = H(56) = 1 0 1 1 1 0 1 | H(18) = 1 0 0 1 1 0 0 |
| H2(45) = H(45) = 1 0 1 1 0 1 1 | H(31) = 1 1 0 0 1 1 1 |
| H2(44) = H(38) = 1 0 1 1 0 0 0 | H(47) = 1 1 0 0 1 0 0 |
| H2(43) = H(52) = 1 0 1 0 1 1 1 | H(23) = 1 1 0 1 0 1 1 |
| H2(42) = H(54) = 1 0 1 0 1 0 0 | H(51) = 1 1 0 1 0 0 0 |
| H2(41) = H(24) = 1 0 1 0 0 1 0 | H(44) = 1 1 0 1 1 1 0 |
| H2(40) = H(16) = 1 0 1 0 0 0 1 | H(40) = 1 1 0 1 1 0 1 |
| H2(39) = H(48) = 1 0 0 1 1 1 1 | H(61) = 1 1 1 0 0 1 1 |
| H2(38) = H(18) = 1 0 0 1 1 0 0 | H(30) = 1 1 1 0 0 0 0 |
| H2(37) = H(32) = 1 0 0 1 0 1 0 | H(22) = 1 1 1 0 1 1 0 |
| H2(36) = H(35) = 1 0 0 1 0 0 1 | H(43) = 1 1 1 0 1 0 1 |
| H2(35) = H(12) = 1 0 0 0 1 1 0 | H(60) = 1 1 1 1 0 1 0 |
| H2(34) = H(26) = 1 0 0 0 1 0 1 | H(21) = 1 1 1 1 0 0 1 |
| H2(33) = H(63) = 1 0 0 0 0 1 1 | H(59) = 1 1 1 1 1 1 1 |
| H2(32) = H(06) = 1 0 0 0 0 0 0 | H(58) = 1 1 1 1 1 0 0 |
| H2(31) = H(57) = 0 1 1 1 1 1 0 | H(01) = 0 0 0 0 0 1 0 |
| H2(30) = H(20) = 0 1 1 1 1 0 1 | H(00) = 0 0 0 0 0 0 1 |
| H2(29) = H(42) = 0 1 1 1 0 1 1 | H(07) = 0 0 0 0 1 1 1 |
| H2(28) = H(29) = 0 1 1 1 0 0 0 | H(02) = 0 0 0 0 1 0 0 |
| H2(27) = H(39) = 0 1 1 0 1 1 1 | H(13) = 0 0 0 1 0 1 1 |
| H2(26) = H(50) = 0 1 1 0 1 0 0 | H(03) = 0 0 0 1 0 0 0 |
| H2(25) = H(46) = 0 1 1 0 0 1 0 | H(27) = 0 0 0 1 1 1 0 |
| H2(24) = H(10) = 0 1 1 0 0 0 1 | H(08) = 0 0 0 1 1 0 1 |
| H2(23) = H(55) = 0 1 0 1 1 1 1 | H(33) = 0 0 1 0 0 1 1 |
| H2(22) = H(37) = 0 1 0 1 1 0 0 | H(04) = 0 0 1 0 0 0 0 |
| H2(21) = H(53) = 0 1 0 1 0 1 0 | H(36) = 0 0 1 0 1 1 0 |
| H2(20) = H(15) = 0 1 0 1 0 0 1 | H(14) = 0 0 1 0 1 0 1 |
| H2(19) = H(17) = 0 1 0 0 1 1 0 | H(49) = 0 0 1 1 0 1 0 |
| H2(18) = H(34) = 0 1 0 0 1 0 1 | H(09) = 0 0 1 1 0 0 1 |
| H2(17) = H(25) = 0 1 0 0 0 1 1 | H(19) = 0 0 1 1 1 1 1 |
| H2(16) = H(05) = 0 1 0 0 0 0 0 | H(28) = 0 0 1 1 1 0 0 |
| H2(15) = H(19) = 0 0 1 1 1 1 1 | H(25) = 0 1 0 0 0 0 1 |
| H2(14) = H(28) = 0 0 1 1 1 0 0 | H(05) = 0 1 0 0 0 0 0 |
| H2(13) = H(49) = 0 0 1 1 0 1 0 | H(17) = 0 1 0 0 1 1 0 |
| H2(12) = H(09) = 0 0 1 1 0 0 1 | H(34) = 0 1 0 0 1 0 1 |
| H2(11) = H(36) = 0 0 1 0 1 1 0 | H(53) = 0 1 0 1 0 1 0 |
| H2(10) = H(14) = 0 0 1 0 1 0 1 | H(15) = 0 1 0 1 0 0 1 |
| H2(09) = H(33) = 0 0 1 0 0 1 1 | H(55) = 0 1 0 1 1 1 1 |
| H2(08) = H(04) = 0 0 1 0 0 0 0 | H(37) = 0 1 0 1 1 0 0 |
| H2(07) = H(27) = 0 0 0 1 1 1 0 | H(46) = 0 1 1 0 0 1 0 |
| H2(06) = H(08) = 0 0 0 1 1 0 1 | H(10) = 0 1 1 0 0 0 1 |
| H2(05) = H(13) = 0 0 0 1 0 1 1 | H(39) = 0 1 1 0 1 1 1 |
| H2(04) = H(03) = 0 0 0 1 0 0 0 | H(50) = 0 1 1 0 1 0 0 |
| H2(03) = H(07) = 0 0 0 0 1 1 1 | H(42) = 0 1 1 1 0 1 1 |
| H2(02) = H(02) = 0 0 0 0 1 0 0 | H(29) = 0 1 1 1 0 0 0 |
| H2(01) = H(01) = 0 0 0 0 0 1 0 | H(57) = 0 1 1 1 1 1 0 |
| H2(00) = H(00) = 0 0 0 0 0 0 1 | H(20) = 0 1 1 1 1 0 1 |

Appendix C. Rearrangement of H2 Matrix Order

The order of the individual entry pairs (H2 matrix column entry plus corresponding addend column entry) is rearranged into (1) eight pairs having LSB=1 and MSB=1, with the highest H2 binary values and having MSB=1, (2) eight pairs having LSB=0 and MSB=1, with the (next) highest H2 binary values; (3) eight pairs having LSB=0 and MSB=0, with the (next) highest H2 binary values; and (4) eight pairs having LSB=1 and MSB=0, having the remaining H2 binary values, in that order. The result of this rearrangement of order of the entry pairs is set forth below as a matrix H3, having a column order as shown, in terms of the original H matrix columns

| H3 Matrix Column | Corres. H Matrix Column |
|---|---|
| H3(01) | H(59) |
| H3(02) | H(63) |

-continued

| H3 Matrix Column | Corres. H Matrix Column |
|---|---|
| H3(03) | H(21) |
| H3(04) | H(26) |
| H3(05) | H(43) |
| H3(06) | H(35) |
| H3(07) | H(61) |
| H3(08) | H(48) |
| H3(09) | H(40) |
| H3(10) | H(16) |
| H3(11) | H(23) |
| H3(12) | H(52) |
| H3(13) | H(31) |
| H3(14) | H(45) |
| H3(15) | H(11) |
| H3(16) | H(56) |
| H3(17) | H(58) |
| H3(18) | H(06) |
| H3(19) | H(60) |
| H3(20) | H(12) |
| H3(21) | H(22) |
| H3(22) | H(32) |
| H3(23) | H(30) |
| H3(24) | H(18) |
| H3(25) | H(44) |
| H3(26) | H(24) |
| H3(27) | H(51) |
| H3(28) | H(54) |
| H3(29) | H(47) |
| H3(30) | H(38) |
| H3(31) | H(62) |
| H3(32) | H(41) |
| H3(33) | H(57) |
| H3(34) | H(01) |
| H3(35) | H(29) |
| H3(36) | H(02) |
| H3(37) | H(50) |
| H3(38) | H(03) |
| H3(39) | H(46) |
| H3(40) | H(27) |
| H3(41) | H(37) |
| H3(42) | H(04) |
| H3(43) | H(53) |
| H3(44) | H(36) |
| H3(45) | H(17) |
| H3(46) | H(49) |
| H3(47) | H(05) |
| H3(48) | H(28) |
| H3(49) | H(20) |
| H3(50) | H(00) |
| H3(51) | H(42) |
| H3(52) | H(07) |
| H3(53) | H(39) |
| H3(54) | H(13) |
| H3(55) | H(10) |
| H3(56) | H(08) |
| H3(57) | H(55) |
| H3(58) | H(33) |
| H3(59) | H(15) |
| H3(60) | H(14) |
| H3(61) | H(34) |
| H3(62) | H(09) |
| H3(63) | H(25) |
| H3(64) | H(19) |

Appendix D. Column-Permuted H Matrix Elements ($H^{cp}$).

The result of the "column-permutation-for-binary-matching" process is the matrix $H^{cp}$ (referred to as "H4" herein), shown in the first column and used to generate the trellis shown in FIG. 3. The second column indicates the original column sequence number for H.

H4 Matrix Column Corresponding H Matrix Column

| H3 Matrix Column | Corresponding H Matrix Column |
|---|---|
| H4(00) = 0000001 | H(01) |
| H4(01) = 0111101 | H(20) |
| H4(02) = 0000111 | H(07) |
| H4(03) = 0111011 | H(42) |
| H4(04) = 0001011 | H(13) |
| H4(05) = 0110111 | H(39) |
| H4(06) = 0001101 | H(08) |
| H4(07) = 0110001 | H(10) |
| H4(08) = 0010001 | H(33) |
| H4(09) = 0101111 | H(55) |
| H4(10) = 0010101 | H(14) |
| H4(11) = 0101001 | H(15) |
| H4(12) = 0011001 | H(09) |
| H4(13) = 0100101 | H(34) |
| H4(14) = 0011111 | H(19) |
| H4(15) = 0100011 | H(25) |
| H4(16) = 0000010 | H(01) |
| H4(17) = 0111110 | H(57) |
| H4(18) = 0000100 | H(02) |
| H4(19) = 0111000 | H(29) |
| H4(20) = 0001000 | H(03) |
| H4(21) = 0110100 | H(50) |
| H4(22) = 0001110 | H(27) |
| H4(23) = 0110010 | H(46) |
| H4(24) = 0010000 | H(04) |
| H4(25) = 0101100 | H(37) |
| H4(26) = 0010110 | H(36) |
| H4(27) = 0101010 | H(53) |
| H4(28) = 0011010 | H(49) |
| H4(29) = 0100110 | H(17) |
| H4(30) = 0011100 | H(28) |
| H4(31) = 0100000 | H(05) |
| H4(32) = 1111100 | H(58) |
| H4(33) = 1000000 | H(06) |
| H4(34) = 1111010 | H(60) |
| H4(35) = 1000110 | H(12) |
| H4(36) = 1110110 | H(22) |
| H4(37) = 1001010 | H(32) |
| H4(38) = 1110000 | H(30) |
| H4(39) = 1001100 | H(18) |
| H4(40) = 1101110 | H(44) |
| H4(41) = 1010010 | H(24) |
| H4(42) = 1101000 | H(51) |
| H4(43) = 1010100 | H(54) |
| H4(44) = 1100100 | H(47) |
| H4(45) = 1011000 | H(38) |
| H4(46) = 1100010 | H(62) |
| H4(47) = 1011110 | H(41) |
| H4(48) = 1111111 | H(59) |
| H4(49) = 1000011 | H(63) |
| H4(50) = 1111001 | H(21) |
| H4(51) = 1000101 | H(26) |
| H4(52) = 1110101 | H(43) |
| H4(53) = 1001001 | H(35) |
| H4(54) = 1110011 | H(61) |
| H4(55) = 1001111 | H(48) |
| H4(56) = 1101101 | H(40) |
| H4(57) = 1010001 | H(16) |
| H4(58) = 1101011 | H(23) |
| H4(59) = 1010111 | H(52) |
| H4(60) = 1100111 | H(31) |
| H4(61) = 1011011 | H(45) |
| H4(62) = 1100001 | H(11) |
| H4(63) = 1011101 | H(56) |

Appendix E. Example of Use of H4 Matrix

Generation of the desired trellis begins with stage 0, which has only one state, the 0-state. The first column of H4 is $h^{cp}_0 = \{0000001\}$. In each stage, the BCH encoder output bit can have only one of two values, "0" or "1." The labels for the first stage are $$S_1(0) = S_0(0) + a^{cp}_0 \cdot h^{cp}_0 = \{000000\} + 0 \cdot \{0000001\} = \{0000000\}, \quad \text{(E-1)}$$

$$S_1(1)=S_0(0)+a^{cp}_1 \cdot h^{cp}_0 = \{0000000\}+1 \{0000001\} = \{0000001\}. \quad \text{(E-2)}$$

The two labels S1 (0) and S (0) are seven-bit formats with binary values BV =0 and BV=1.

For stage 1, two states are available, namely "0" and "1." Two branches are output from state "0" at stage 0. The number of input branches of states in stage 1 is 1. For state "0" in stage 1, the input branch corresponds to the encoder output "0"; for state "1" in stage 1, the input branch corresponds to the encoder output 1.

For stage 2, the second column of H4 is $h_1=\{0111101\}$. The labels for the second stage are $$S_2(0)=S1(0)+a^{cp}_0 \cdot h^{cp}_1 = \{0000000\}+ 0 \cdot \{0111101\} = \{0000000\}, \quad \text{(E-3)}$$

$$S_2(1)=S_1(0)+a^{cp}_1 \cdot h^{cp}_1 = \{0000000\}+ 1 \cdot \{0111101\} = \{0111101\}, \quad \text{(E-4)}$$

$$S_2(2)=S_1(1)+a^{cp}_0 \cdot h^{cp}_1 = \{0000001\}+ 0 \cdot \{01111011\} = \{0000001\}, \quad \text{(E-5)}$$

$$S_2(3)=S_1(1)+a^{cp}_1 \cdot h^{cp}_1 = \{0000001\}+ 1 \cdot \{0111101\} = \{0111100\}. \quad \text{(E-6)}$$

The four labels for stage 2, $S_2(0)$, $S_2(1)$, $S_2(2)$ and $S_2(3)$, have the respective binary values BV of 0, 61, 1 and 60. The number of input branches of the states in stage 2 is 1. This bifurcation process continues until stage 32.

Because only one state ("0") occurs in the last stage (stage 63), one can also generate a trellis by moving backward from stage 63, also ending at stage 32.

The corresponding labels for stage 62 and 61 become $$S_{62}(0)=S_{63}(0)+a^{cp}_0 \cdot h^{cp}_{63} = \{000000\}+ 0 \cdot \{1011101\} = \{0000000\}, \quad \text{(E-7)}$$

$$S_{62}(1)=S_{63}(0)+a^{cp}_0 \cdot h^{cp}_{63} = \{0000000\}+ 1 \cdot \{1011101\} = \{1011101\}, \quad \text{(E-8)}$$

$$S_{61}(0)=S_{62}(0)+a^{cp}_0 \cdot h^{cp}_{62} = \{0000000\}+ 0 \cdot \{1100001\} = \{0000000\}, \quad \text{(E-9)}$$

$$S_{61}(1)=S_{62}(0)+a^{cp}_1 \cdot h^{cp}_{62} = \{0000000\}+ 1 \cdot \{1100001\} = \{1100001\}, \quad \text{(E-10)}$$

$$S_{61}(2)=S_{62}(1)+a^{cp}_0 \cdot h^{cp}_{62} = \{1011101\}+ 0 \cdot \{1100001\} = \{1011101\}, \quad \text{(E-11)}$$

$$S_{61}(3)=S_{62}(1)+a^{cp}_1 \cdot h^{cp}_{62} = \{1011101\}+ 1 \cdot \{1100001\} = \{0111101\}, \quad \text{(E-12)}$$

with corresponding binary values BV of 0, 93, 0, 97, 93 and 61, respectively.

The trellis generated in a forward direction (beginning at stage 1) will merge with the trellis moving in a backward direction (beginning at stage 64). The forward-moving and backward-moving trellises merge at stage 32. Beyond stage 32, one can remove from the forward-moving trellis states that were included in only one of the forward-moving and the backward-moving trellises; this includes removal of the corresponding input and output branches. This processing results in the (symmetric) trellis shown in FIG. 3.

Where the number of states in stage i+1 is no greater than the number of states in stage i, the number of input branches for each state in stage i+1 is 2. Where the number of states in stage i+1 is greater than the number of states in stage i, the number of input branches for each state in stage i+1 is 1.

What is claimed is:

1. A method of constructing a simplified trellis diagram for BCH encoding of information, the method comprising:

receiving information having a corresponding (n−k)×(n) parity check matrix H, constructed according to a BCH error code, where n and k are selected positive integers with k<n;

expressing the parity check matrix H as an ordered sequence of columns of matrices $\{h_1, h_2, \ldots, h_n\}$;

providing a sequence of sub-code words $a_i=\{c_1, \ldots, c_i\}$ (i=1, ..., n), corresponding to at least one code word $c=\{c_1, \ldots, c_n\}$ that satisfies $c \cdot H^{tr}=0_{n-k}$;

applying a column-permutation-for-binary-matching process to the columns of the matrix H to provide a matrix $H^{cp}$, having columns $\{h^{cp}_1, h^{cp}_2, \ldots, h^{cp}_n\}$ that are a selected permutation of the columns of the matrix H;

providing a sequence of sub-matrices $H^{cp}_i = \{h^{cp}_1, \ldots, h^{cp}_i\}$, providing a corresponding permuted code word $c^{cp} = \{c^{cp}_1, \ldots, c^{cp}_n\}$, and providing a sequence of corresponding permuted sub-code words $a^{cp}_i = \{c^{cp}_1, \ldots, c^{cp}_i\}$; and generating a trellis diagram, symmetric about a central location and representing an ordered sequence of code word transitions, in the received information, for the at least one code word c, connecting n+1 stages, numbered i=0, 1, ..., n, in an ordered sequence, where each of stage i=0 and stage i=n in the trellis has one state, each stage has at least one state, and (i) where the number of states in stage i+1 is no greater than the number of states in stage i, the number of input branches for each state in stage i+1 is 2, (ii) where the number of states in stage i+1 is greater than the number of states in stage i, the number of input branches for each state in stage i+1 is 1, and (iii) a state in stage i+1 is determined by a sum of a corresponding state in stage i and a product of the matrix $H^{cp}_i$ and the sub-code word bit value $a^{cp}_i$.

2. The method of claim 1, further comprising generating said trellis diagram in a form so that the number of states in a first stage, numbered i($0 \leq i \leq n/2$) is equal to the number of states in a second stage, numbered n−i.

3. The method of claim 1, further comprising choosing said integer n to be divisible by 8.

4. The method of claim 1, further comprising choosing said integer n=64.

* * * * *